United States Patent
Angermann et al.

(10) Patent No.: US 10,217,923 B2
(45) Date of Patent: Feb. 26, 2019

(54) METHOD FOR THE PRODUCTION OF A THERMOELECTRIC MODULE

(75) Inventors: Hans-Heinrich Angermann, Stuttgart (DE); Holger Brehm, Erdmannhausen (DE); Thomas Himmer, Reichenbach (DE)

(73) Assignee: MAHLE INTERNATIONAL GMBH, Stuttgart (DE)

(*) Notice: Subject to any disclaimer, the term of this patent is extended or adjusted under 35 U.S.C. 154(b) by 704 days.

(21) Appl. No.: 14/003,898

(22) PCT Filed: Mar. 7, 2012

(86) PCT No.: PCT/EP2012/053945
§ 371 (c)(1),
(2), (4) Date: Nov. 18, 2013

(87) PCT Pub. No.: WO2012/120060
PCT Pub. Date: Sep. 13, 2012

(65) Prior Publication Data
US 2014/0060605 A1  Mar. 6, 2014

(30) Foreign Application Priority Data
Mar. 8, 2011 (DE) ......................... 10 2011 005 246

(51) Int. Cl.
*H01L 35/34* (2006.01)
*F01N 5/02* (2006.01)
(Continued)

(52) U.S. Cl.
CPC .............. *H01L 35/34* (2013.01); *F01N 5/025* (2013.01); *H01L 35/30* (2013.01); *H01L 35/32* (2013.01); *Y02T 10/16* (2013.01); *Y02T 10/166* (2013.01)

(58) Field of Classification Search
CPC .......... H01L 35/30; H01L 35/34; H01L 35/32
See application file for complete search history.

(56) References Cited

U.S. PATENT DOCUMENTS 3,225,549 A   12/1965  Elfving
4,976,103 A * 12/1990  Takikawa ................. B01J 35/04
                                                    422/180
(Continued)

FOREIGN PATENT DOCUMENTS

AT   506 262 A2   7/2009
CN   1166891 A    12/1997
(Continued)

OTHER PUBLICATIONS

"Coefficients of Linear Thermal Expansion" accessed from http://www.engineeringtoolbox.com/linear-expansion-coefficients-d_95.html, accessed on Dec. 26, 2016.*
(Continued)

*Primary Examiner* — Golam Mowla
(74) *Attorney, Agent, or Firm* — Paul D. Strain, Esq.; Strain & Strain PLLC

(57) ABSTRACT

The invention relates to a thermoelectric module comprising a metal housing element and a ceramic layer that is applied to the metal housing element. The thermoelectric module further comprises an additional housing element arranged on the side of the metal housing element which is provided with the ceramic layer, the additional housing element and the metal housing element being joined to form a fluid-tight housing. The thermoelectric module finally comprises at least one thermoelectrically active material which is arranged inside the fluid-tight housing.

23 Claims, 15 Drawing Sheets

Figure 1:
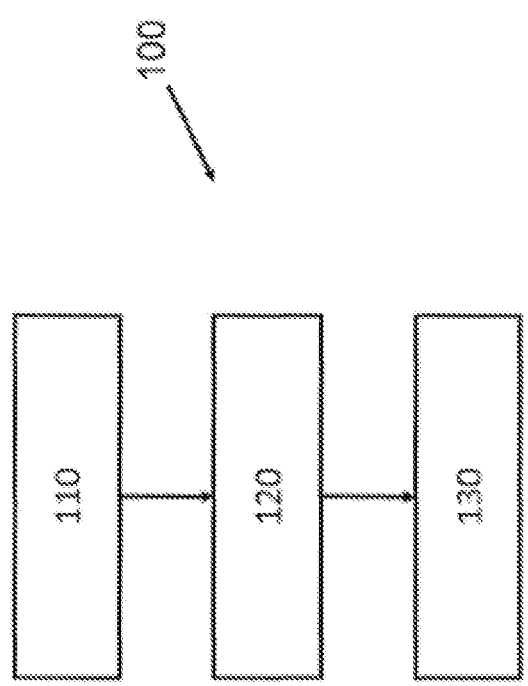

(51) Int. Cl.
*H01L 35/30* (2006.01)
*H01L 35/32* (2006.01)

(56) References Cited

U.S. PATENT DOCUMENTS

| | | | | |
|---|---|---|---|---|
| 5,623,119 | A * | 4/1997 | Yater | H01L 35/00 |
| | | | | 136/203 |
| 5,834,070 | A * | 11/1998 | Movchan | C23C 14/027 |
| | | | | 427/126.1 |
| 5,841,064 | A | 11/1998 | Maekawa et al. | |
| 5,875,098 | A * | 2/1999 | Leavitt | H01L 35/32 |
| | | | | 136/203 |
| 6,274,803 | B1 | 8/2001 | Yoshioka et al. | |
| 6,700,053 | B2 * | 3/2004 | Hara | H01L 23/38 |
| | | | | 136/203 |
| 2005/0150538 | A1 * | 7/2005 | Liu | H01L 35/32 |
| | | | | 136/205 |
| 2006/0118159 | A1 * | 6/2006 | Tsuneoka | H01L 35/04 |
| | | | | 136/211 |
| 2008/0149158 | A1 * | 6/2008 | Logan | H01L 23/38 |
| | | | | 136/203 |
| 2008/0163916 | A1 * | 7/2008 | Tsuneoka | H01L 35/32 |
| | | | | 136/203 |
| 2010/0154855 | A1 | 6/2010 | Nemir et al. | |
| 2010/0229911 | A1 * | 9/2010 | Leavitt | H01L 35/16 |
| | | | | 136/239 |

FOREIGN PATENT DOCUMENTS

| | | |
|---|---|---|
| CN | 1518776 A | 8/2004 |
| CN | 1783526 A | 6/2006 |
| DE | 10 2009 013 535 A1 | 9/2010 |
| DE | 10 2009 036 749 A1 | 2/2011 |
| EP | 1 230 475 B1 | 3/2006 |
| GB | 1 103 388 A | 2/1968 |
| GB | 1 204 884 A | 9/1970 |
| JP | 2003-234515 A | 8/2003 |
| JP | 2004-274072 A | 9/2004 |
| JP | 2009-117792 A | 5/2009 |
| WO | WO 2010/051219 A1 | 5/2010 |

OTHER PUBLICATIONS

International Search Report, PCT/EP2012/053945, dated Mar. 15, 2013, 3 pgs.
German Search Report, DE 10 2011 005 246.1, dated Oct. 17, 2011, 8 pgs.

* cited by examiner

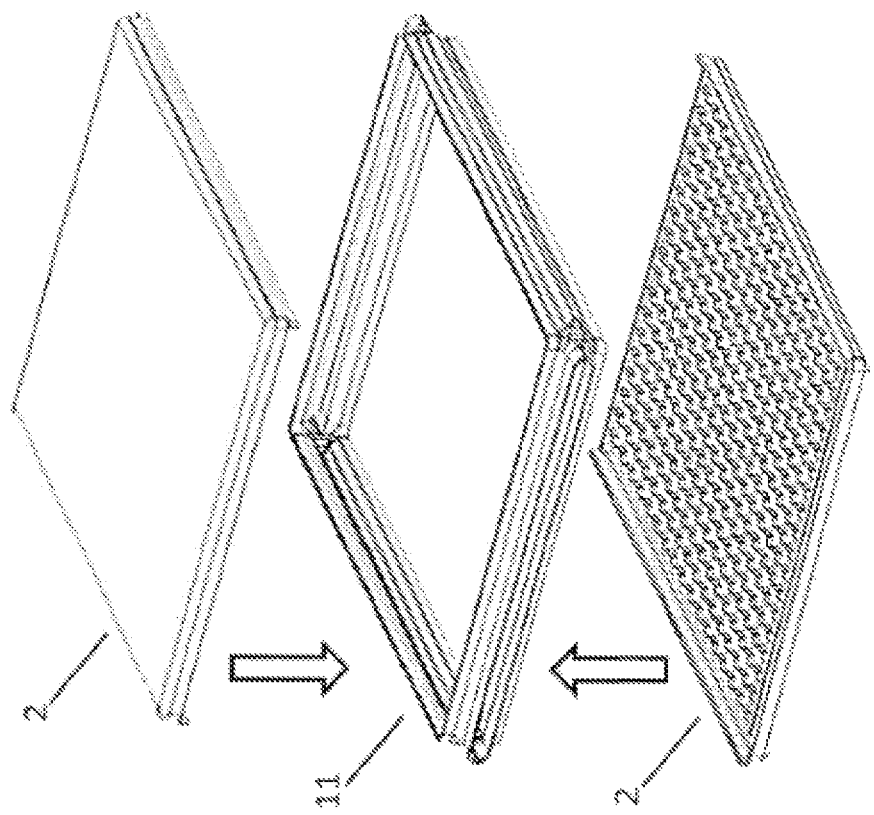

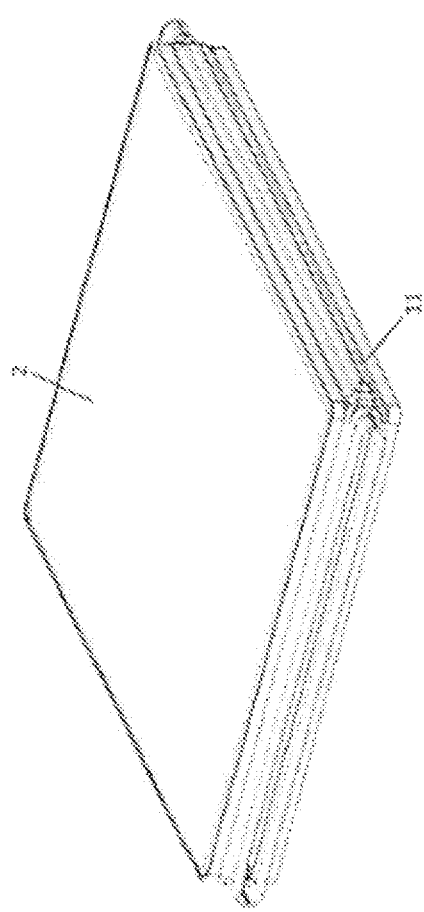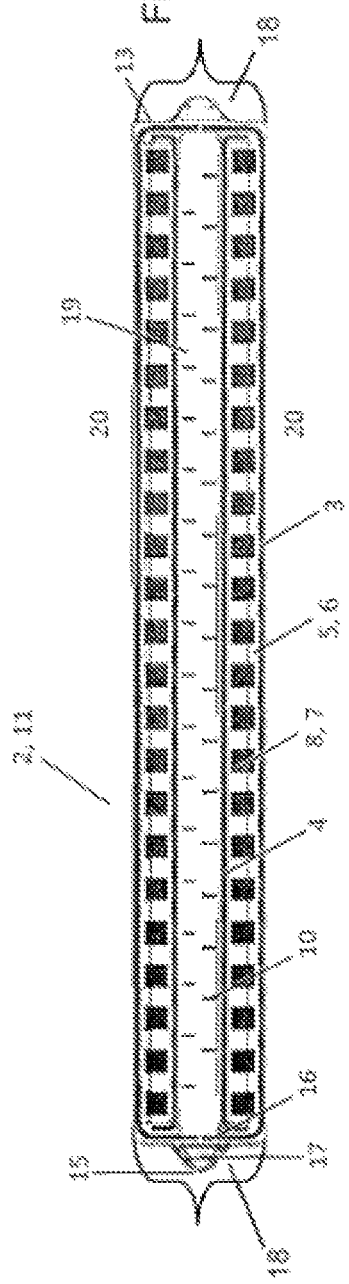

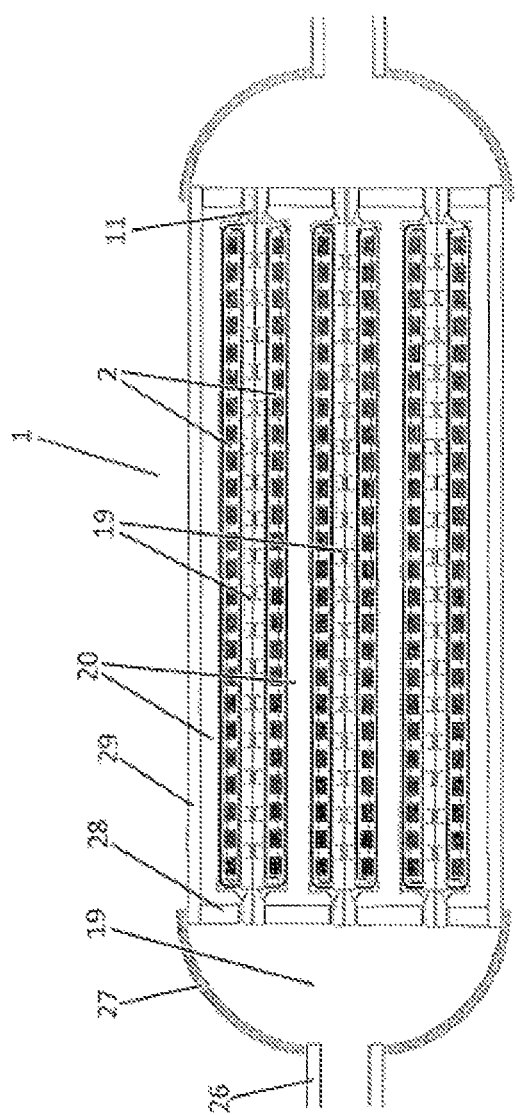

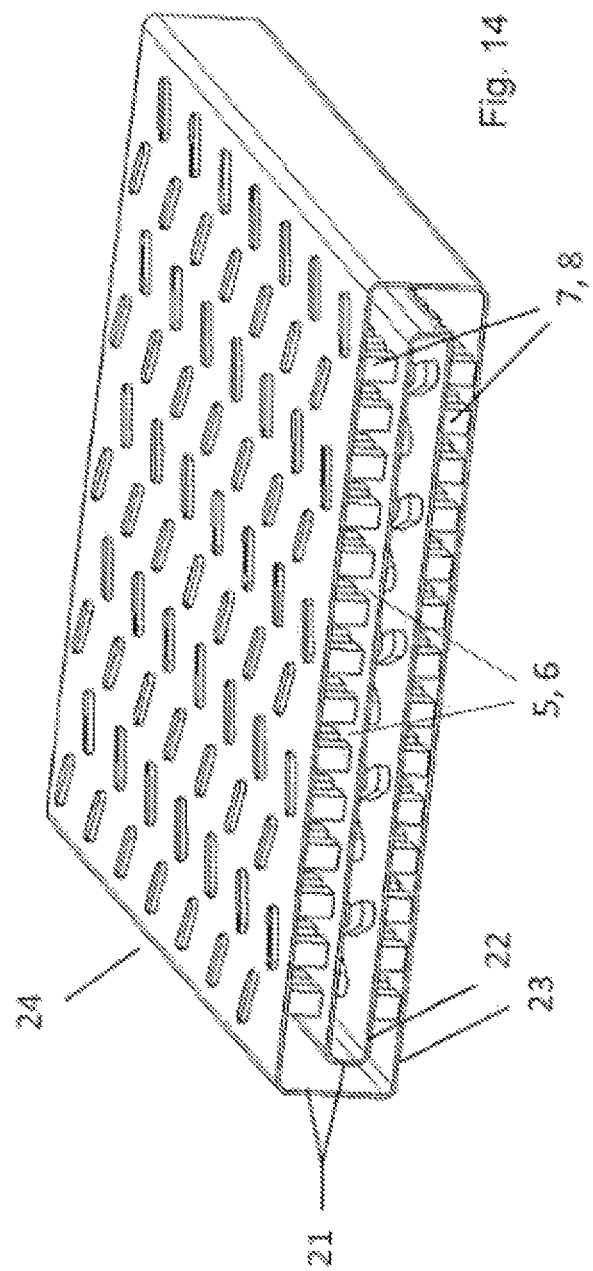

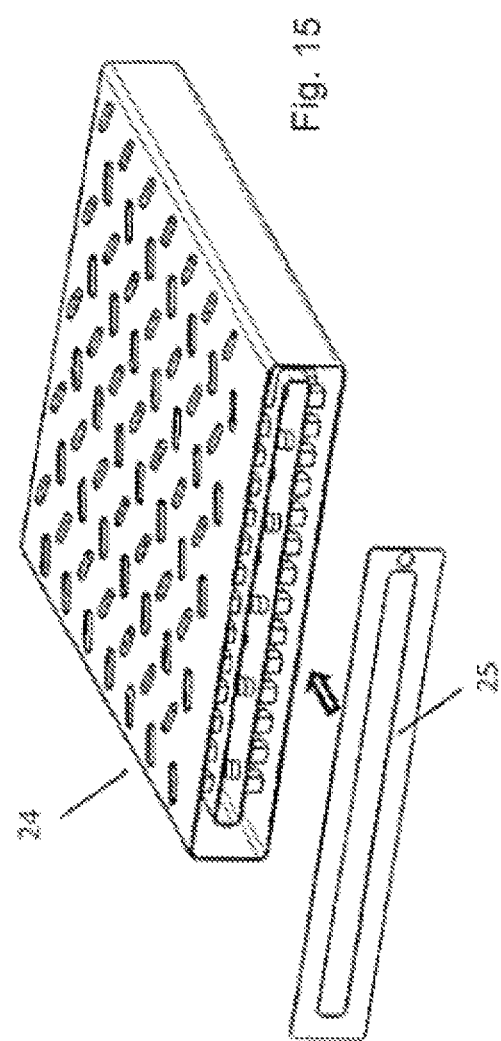

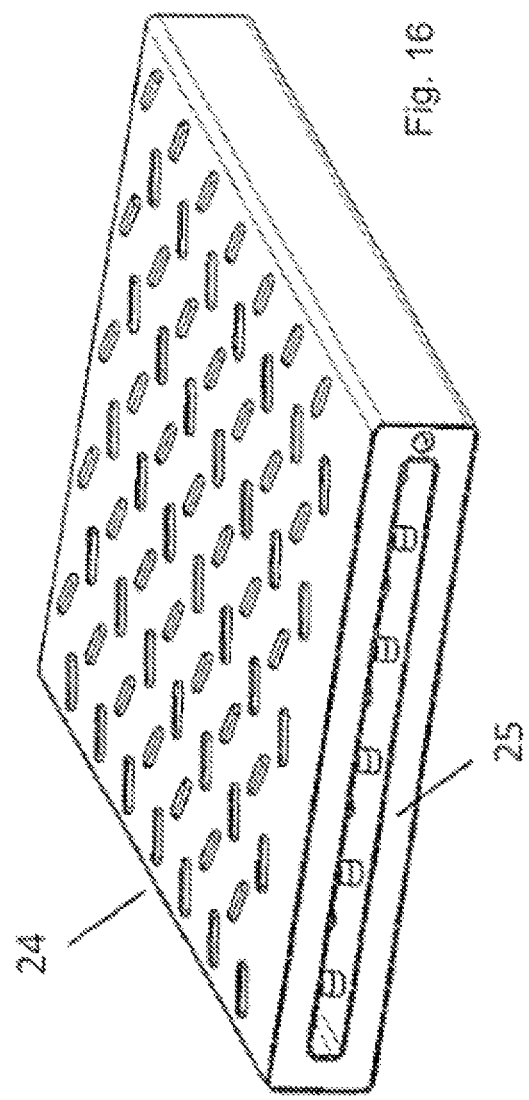

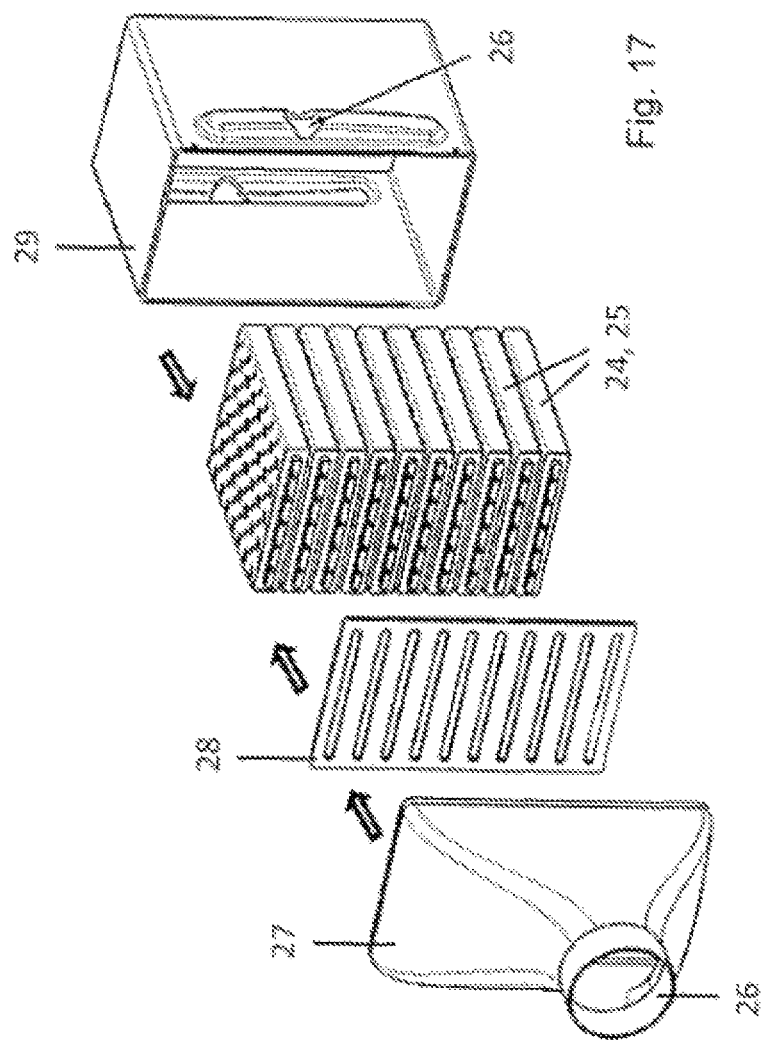

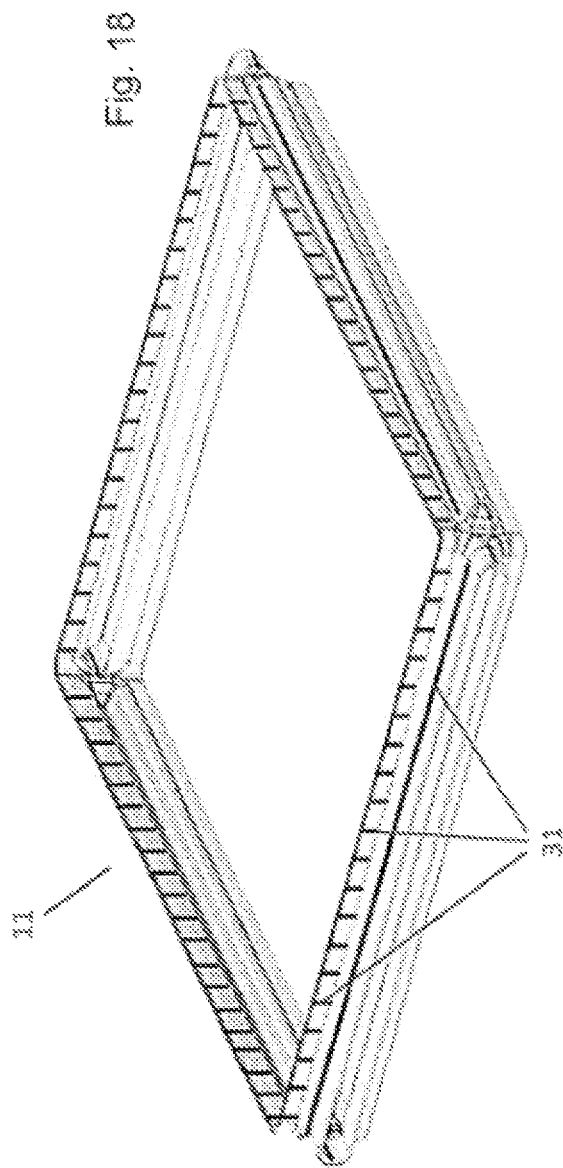

METHOD FOR THE PRODUCTION OF A THERMOELECTRIC MODULE

CROSS-REFERENCE TO RELATED PATENT APPLICATIONS

This application is a National Stage of International Application No. PCT/EP2012/053945, filed Mar. 7, 2012, which is based upon and claims the benefit of priority from prior German Patent Application No. 10 2011 005 246.1, filed Mar. 8, 2011, the entire contents of all of which are incorporated herein by reference in their entirety.

The present invention relates to a method for the production of a thermoelectric module as claimed in claim 1.

The energy which is stored in the exhaust gas of a motor vehicle in the form of heat has up to now been discharged unutilized to the surroundings or environment. In order to increase the degree of efficiency of the system (for example of the vehicle) and, as a result, to reduce the $CO_2$ emissions during operation, a TEG (TEG=thermoelectric generator) is implemented, the TEM (TEM=thermoelectric module) of which converts part of the heat into electrical energy and returns said energy to the system. The TEG can be accommodated with different uses at any desired point in the exhaust gas section or in the exhaust gas recirculation means. Conventional TEMs according to the prior art are not suitable in an optimum manner for use in a TEG on account of their design and connecting technology and are also less effective. The TEMs therefore have to be incorporated and attached electrically in an optimum way.

One example for a conversion of thermal energy into electrical energy is disclosed in EP 1230475 B1. However, it proves disadvantageous in the solutions which are known in the prior art that they are less efficient on account of the high total thermal resistance between TE-active materials and the heat source/sink (TE materials=thermoelectric materials, that is to say materials which have the property of generating electrical energy from thermal energy). Furthermore, the incorporation of the TEM into a heat exchanger is less practicable and the connecting techniques of the components which are used are partially unstable with respect to high temperatures, which is necessary, however, in order to implement the special advantages of an approach of this type. A low thermal exchange on the gas-side connection of the TEM in the heat exchanger can also be realized in the solutions according to the prior art, and merely a poor electric connection of the TE materials can be produced. Problems also occur when different materials with excessively different coefficients of thermal expansion are paired, in relation to the connecting technique which is used and its behavior during the thermocyclic operation.

It is the object of the present invention to provide an improved method for the production of a thermoelectric module and an improved thermoelectric module.

This object is achieved by a method for the production of a thermoelectric module as claimed in claim 1 and by a thermoelectric module as claimed in claim 10.

The present invention provides a method for the production of a thermoelectric module, the method having the following steps:
- application of a ceramic layer and, hereon, electric conductor tracks to a metallic housing element;
- arrangement of at least one thermoelectrically active material on the housing element, the arrangement taking place in such a way that the ceramic layer and the conductor tracks are situated between the metallic housing element and the thermoelectrically active material; and
- attachment of a further housing element, with the result that the thermoelectrically active material is closed in a fluid-tight manner between the housing element and the further housing element and is connected electrically, in order to produce the thermoelectric module.

Furthermore, the present invention provides a thermoelectric module having the following features:
- a metallic housing element;
- a ceramic layer which is applied on the metallic housing element, and electric conductor tracks which are situated thereon;
- a further housing element which is arranged on that side of the metallic housing element which has the ceramic layer, and the further housing element and the metallic housing element being connected to form a fluid-tight housing; and
- at least one thermoelectrically active material which is arranged in the fluid-tight housing, in particular on the electric conductor tracks.

The present invention is based on the finding that a very satisfactory insulation property between the thermoelectrically active elements and a metallic housing wall can be achieved if a ceramic layer is applied to at least one housing element. Said ceramic layer makes very satisfactory electric insulation of the thermoelectric materials possible at very high temperatures, to which the thermoelectric module is exposed, in particular, during the operation in exhaust gas sections of vehicles. Other insulation materials would already be destroyed or considerably damaged at temperatures of this type. The present invention therefore affords a considerable advantage if a thermoelectric module is to be used in a use environment, in which very high temperatures prevail. A further aspect of the present invention is to be seen in the fact that the materials which are used are to have identical or at least similar coefficients of thermal expansion. To this end, it is expedient to construct the heat exchangers as far as possible by way of thermal sprayed layers, in order as far as possible to minimize the introduction of solders with different coefficients of thermal expansion than the other materials.

It is favorable if the attachment step comprises a part step of spraying ceramic basic material onto the metallic housing element, the ceramic basic material being configured to form the ceramic layer. An embodiment of this type of the present invention affords the advantage that spraying provides the possibility of applying the ceramic layer which can be carried out very simply technically and inexpensively. In particular, a surface of the metallic housing element can also be roughened before spraying, for example by sandblasting or etching, in order to ensure an improvement in the mechanical adhesion of the ceramic basic material on the metallic housing element. Moreover, the natural oxide layer of the stainless steel can be removed, which oxide layer might have a negative influence on the adhesion of the applied material. The ceramic basic material can then harden after spraying and form the ceramic layer. Plasma spraying is particularly preferred for spraying ceramic.

In the application step, a material can also be applied to the housing element, which material is configured to form a ceramic layer which has a coefficient of thermal expansion which corresponds within a tolerance range to a metallic material of the housing element. An embodiment of this type of the present invention affords the advantage that no excessively great differences in the expansion behavior of the ceramic layer and of the metallic housing element occur during operation of the produced thermoelectric element, with the result that the risk of the ceramic layer detaching from the metallic housing element as a result of thermomechanical stresses is reduced.

In order to achieve electric connection of the thermoelectrically active materials among one another and externally which is as satisfactory as possible, a part step of the formation of electrically conductive regions, for example connecting layers, on the ceramic layer can be carried out in the application step, the at least one thermoelectrically active material being applied on the electrically conductive region in the arrangement step. An embodiment of this type of the present invention affords the advantage that the at least one electrically conductive region can also be produced very simply by way of processes which are technically mature and therefore inexpensive.

In particular, the formation part step can comprise spraying on of an electrically conductive material, in order to form the electrically conductive regions. Here, thermal spraying such as wire flame spraying can be used, for example. It is possible to spray on the satisfactorily electrically conducting elements Cu or Ag or alloys thereof.

A very long service life of the thermoelectric module can be achieved if a material is applied to the ceramic layer in the formation part step, the coefficient of thermal expansion of which material corresponds to the material, from which the metallic housing element is formed, or in which method nickel is applied to the ceramic layer in the formation part step, in order to form the electrically conductive region. As a result, it is made possible firstly that the thermal expansion of the individual materials cannot lead to high thermomechanical stresses and secondly a barrier layer for confining an undesirable element diffusion of foreign atoms into the thermoelectrically active material can also be formed if nickel is used. It is also advantageous that Ni has a relatively low specific electrical resistance.

Reliable electric connection of the thermoelectrically active material can be carried out particularly efficiently if a silver sintering or silver pressure sintering process is used in the arrangement step for the material-to-material connection of the thermoelectrically active material to the at least one electrically conductive region. The silver sintering or silver pressure sintering connecting layer should optionally be of porous configuration (with porosities of at least 15, typically 30°%), in order to compensate for any possible differences of coefficient of thermal expansion of the adjoining materials.

As an alternative, a process, in which a (reactive nano-) soldering foil is used, for the material-to-material connection of the thermoelectrically active material to the at least one electrically conductive region can also be used in the arrangement step. An embodiment of this type of the present invention affords the advantage of the option to use a connecting technique which is already mature for the electric connection of the thermoelectrically active material to the electrically conductive region.

In particular, in order to achieve high mechanical stability at high operating temperatures, the thermoelectrically active material can be sprayed onto the electrically conductive region in the arrangement step. In an embodiment of this type, the spraying of the thermoelectrically active material onto the electrically conductive region can achieve a situation where the material-to-material connection between the electrically conductive region and the thermoelectrically active material is very stable even at very high temperatures. A material-to-material connection on the basis of a different connecting method can then be used on a second side of the thermoelectrically active material, with the result that, for example, said connection by way of the different connecting method can be used for that side of the thermoelectric module, on which the colder of the two fluids is conducted during operation of said thermoelectric module. In this way, a thermoelectric module which has a long service life even at very high operating temperatures can be produced.

The present invention also provides a thermoelectric apparatus having a first thermoelectric module as has been described above, which thermoelectric module has a projection on the housing element or on the further housing element of the first thermoelectric module. Furthermore, a thermoelectric module of this type comprises a second thermoelectric module as has been described above, in which the housing element or the further housing element of the second thermoelectric module is fastened in a fluid-tight manner to the projection in such a way that a chamber for conducting a fluid is formed between the first and second thermoelectric modules. An embodiment of this type of the present invention affords the advantage of a very compact overall design of a thermoelectric apparatus, since a fluid which flows in the chamber flows both past one side of the first thermoelectric module and past one side of the second thermoelectric module and the available installation space can therefore be utilized very efficiently as a result of the fluid routing.

According to another embodiment of the present invention, the thermoelectric apparatus can comprise a first and a second thermoelectric module, in each case as have been described above. In addition, the thermoelectric apparatus can have a holding device which connects the first and second thermoelectric modules to one another in a fluid-tight manner, with the result that a chamber for conducting a fluid is formed between the first and second thermoelectric modules. An embodiment of this type of the present invention also affords the advantage of a very compact overall design, since a fluid which flows in the chamber flows both past one side of the first thermoelectric module and past one side of the second thermoelectric module. Here, the holding device can be introduced or used as an element which is of very simple design and is therefore inexpensive.

Furthermore, it is favorable if the housing element or the further housing element of the first thermoelectric module has a projection, the second second thermoelectric module being arranged on the projection in such a way that the projection acts as a thermal partition element between the first and second thermoelectric modules. In this way, thermal insulation or impeded thermal exchange from the first to the second thermoelectric module can advantageously take place, with the result that the degree of efficiency of the thermoelectric apparatus can be optimized.

Figure 2:
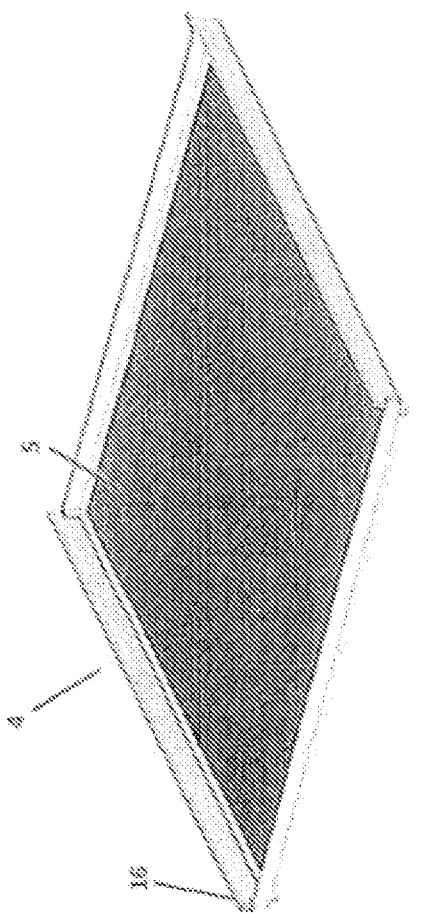
Figure 3:
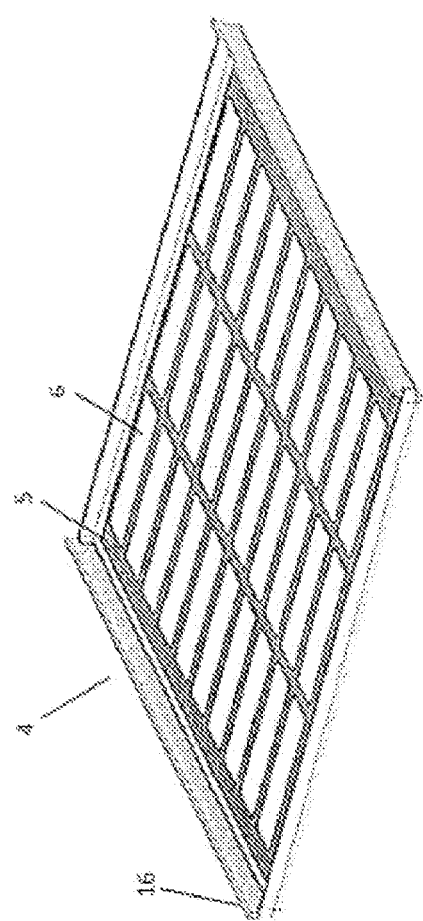
Figure 4:
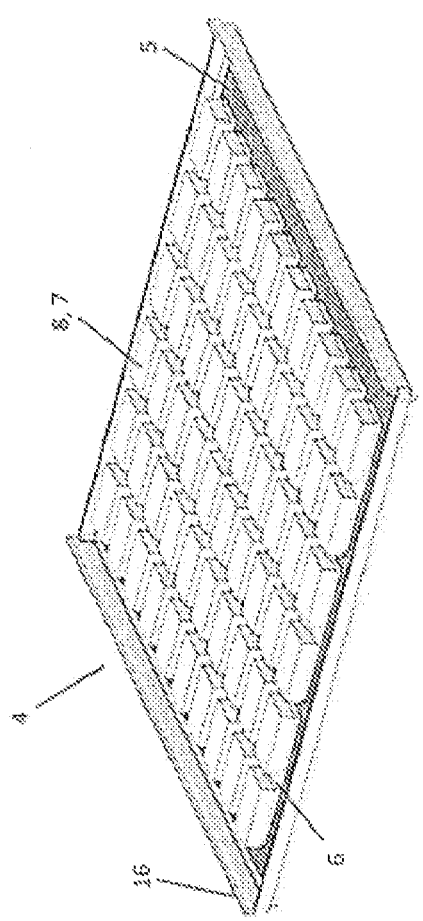
Figure 5:
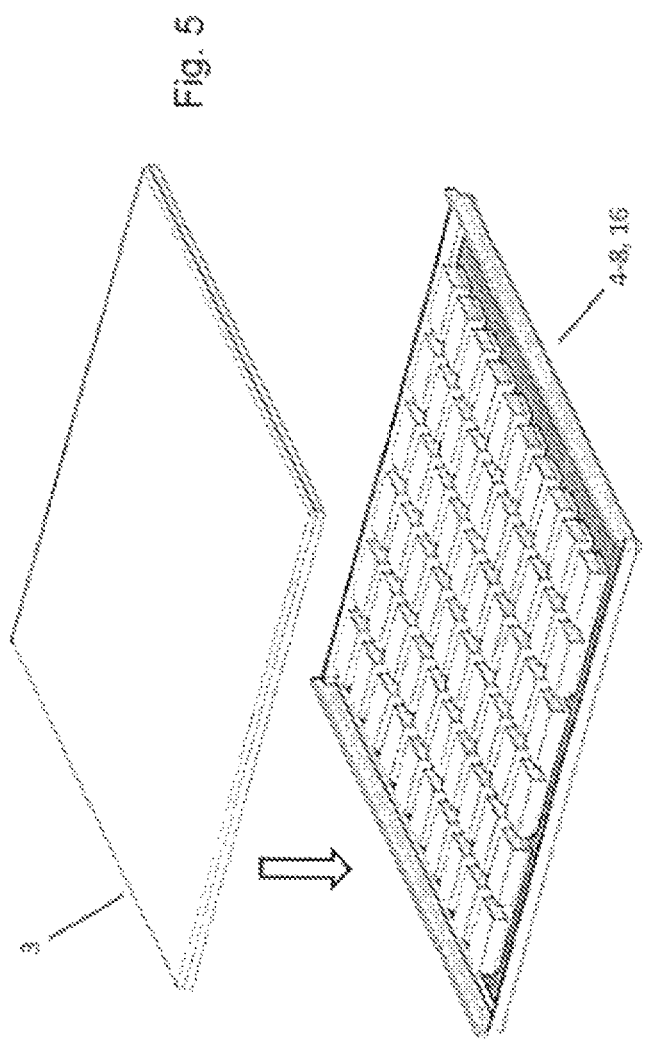
Figure 6:
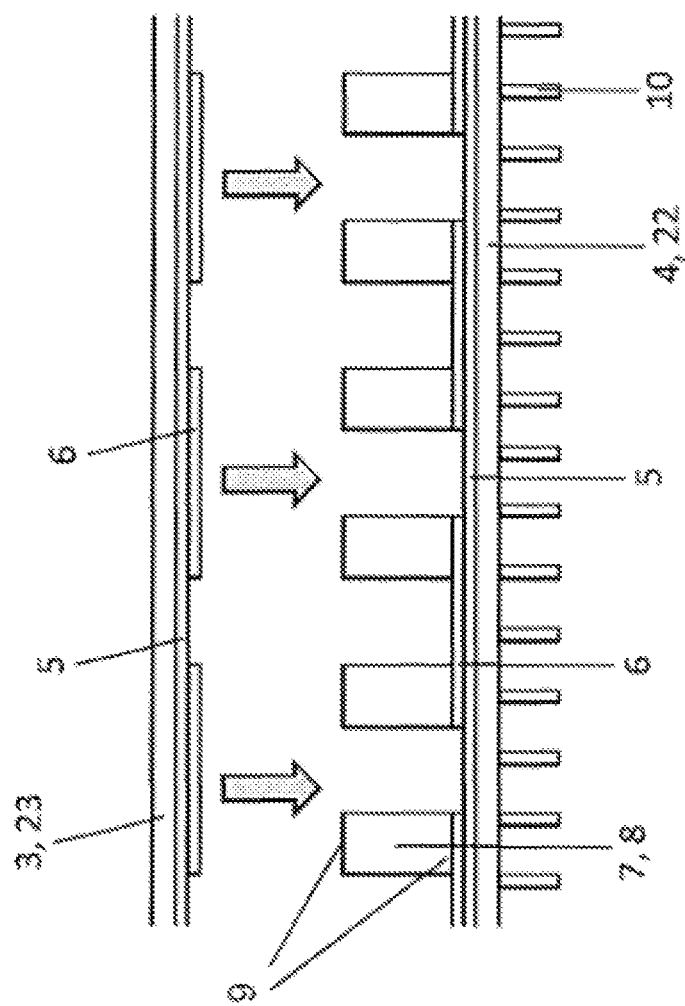
Figure 7:
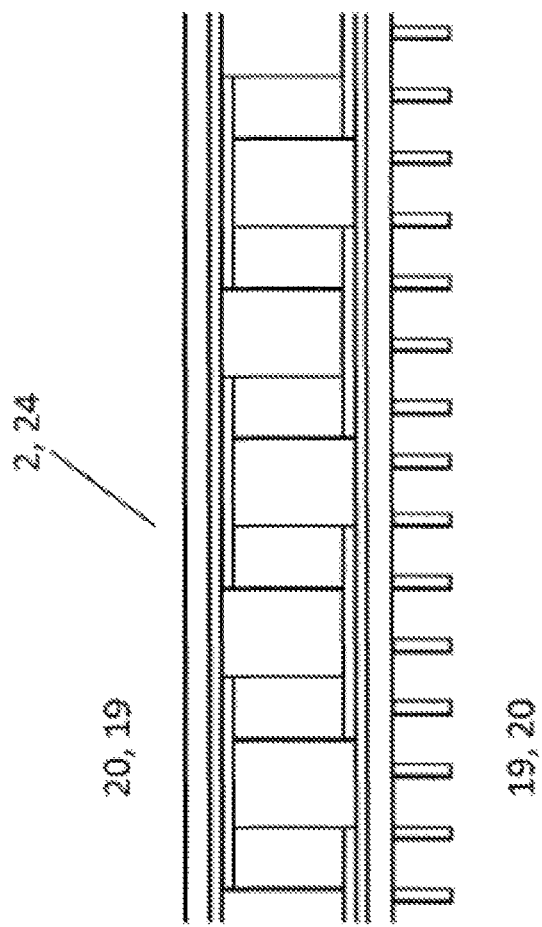
Figure 8:
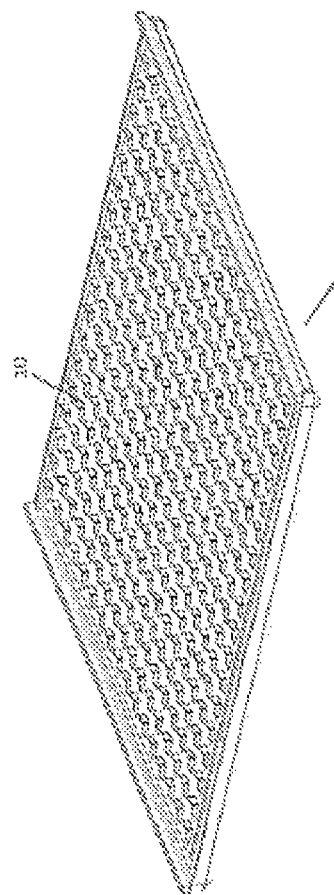
Figure 9:
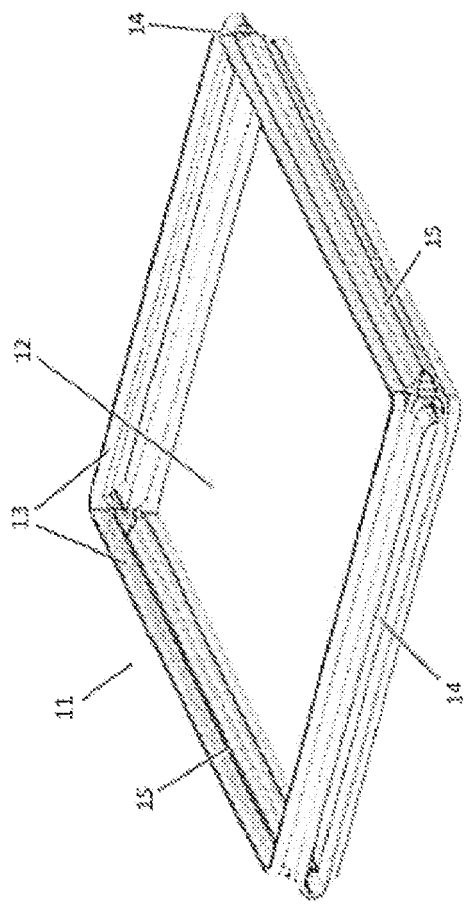

Advantageous exemplary embodiments of the present invention will be explained in greater detail in the following text with reference to the appended drawings, in which:

FIG. 1 shows a flow chart of one exemplary embodiment of the present invention as a method, FIG. 2 shows a perspective view of a TEM enveloping body lower part, FIG. 3 shows a perspective view of a TEM enveloping body lower part with electric conductors, FIG. 4 shows a perspective view of a TEM enveloping body lower part with electric conductors and TE materials, FIG. 5 shows a perspective view of a joining operation of a TEM enveloping body upper part to a TEM enveloping body lower part with electric conductors and TE materials, FIG. 6 shows details in a cross-sectional or longitudinal sectional view of upper and lower components of the TEM or the TEM/tube during joining, FIG. 7 shows details in a cross-sectional or longitudinal sectional view of upper and lower components of the TEM or the TEM/tube after joining, FIG. 8 shows a perspective view of a TEM, FIG. 9 shows a perspective view of a holding device, FIG. 10 shows a perspective view of a joining operation of the TEM to the holding device, FIG. 11 shows a perspective view of a TEM with holding device, FIG. 12 shows a cross-sectional view of a TEM with holding device, FIG. 13 shows a longitudinal sectional view of a TEG with TEM and holding device, FIG. 14 shows a perspective view of a TEM/tube, FIG. 15 shows a perspective view of a joining operation of a TEM/tube to a cover, FIG. 16 shows a perspective view of a TEM/tube with TEM/tube cover, FIG. 17 shows a perspective view of a joining operation of a TEG to a TEM/tube, and FIG. 18 shows a perspective view of a holding device with thinned material portions.

In the following description of favorable exemplary embodiments of the present invention, identical or similar designations will be used for the elements which are shown in the various drawings and act in a similar manner, a repeated description of said elements being dispensed with. In the following text, the invention will be explained using different dimensions and measurements; the invention is not to be understood as being restricted to said dimensions and measurements.

FIG. 1 shows a flow chart of one exemplary embodiment of the present invention as a method 100 for the production of a thermoelectric module. The method 100 has an application step 110 for a ceramic layer and electric conductor tracks to a metallic housing element. Furthermore, the method comprises an arrangement step 120 for at least one thermoelectrically active material on the housing element, the arrangement 120 being carried out in such a way that the ceramic layer is situated between the metallic housing element and the thermoelectric material. Finally, the method 100 comprises an attachment step 130 for a further housing element, with the result that the thermoelectric material is closed in a fluid-tight manner between the housing element and the further housing element and is connected electrically, in order to form the thermoelectric module.

At least one production method or one method technique for the production of a thermoelectric module is therefore disclosed in the present invention. Here, the construction of a thermoelectric module 2, 24 can take place, in particular, with the use of a thermal spraying process and/or soldering, as will be described in even greater detail in the following text. In parallel with this, materials are disclosed which are joined together by way of the method technique described to form a thermoelectric module.

A thermoelectric generator 1 will be exposed during operation in an automotive environment to temperature differences of 500 K or more across the component and rapid heating cycles. Both trigger thermomechanical stresses. The fundamental concept of the present invention consists in the fact that metallic materials 3, 4, 6, 21, 22, 23 and ceramic materials 5 are selected at least for one housing element, but preferably for a plurality of housing elements which are connected to one another in a fluid-tight manner, which materials favorably are suited in terms of the coefficient of thermal expansion, that is to say lie within a tolerance range of, for example, 40%, favorably 20%. This means that the coefficient of expansion of one of the materials differs from the coefficient of expansion of the other material at most by 40%, favorably by 20%. Since metals tend to have a high coefficient of thermal expansion and ceramics tend to have a relatively low coefficient of thermal expansion, the metals should be at the lower end in this regard and the ceramics should be at the upper end in this regard.

A metallic candidate material is, for example, ferritic stainless steel 3, 4, 6, 21, 22, 23, such as the stainless steel material 1.4509 or 1.4512. They have a coefficient of thermal expansion of 10 ppm/K at room temperature and of 11 ppm/K at 600° C. An additional advantage of materials of this type consists in the fact that ferritic stainless steel is ferromagnetic and can therefore be clamped magnetically for the coating 5. A soft-annealed material is roughened, for example by means of sandblasting or etching, before the coating for the improved mechanical interlocking of the ceramic layer 5. Moreover, an oxide layer which disrupts the adhesion is reduced or even removed. 0.5 mm might be considered as thickness of the stainless steel material. A housing element, as can be produced by way of the method which is presented in the above text, is shown as a perspective view in FIG. 2.

The ceramic insulating layer 5 is applied directly to the stainless steel 3, 4, 22, 23 in a defined size, for example 80×60 mm. Thermal spraying, in particular plasma spraying, serves as application process, for example. The defined shape of the ceramic layer 5 is achieved by the use of masks between plasma gun and basic material. The coefficient of thermal expansion of the ceramic should be adapted to that of the ferritic stainless steel. $ZrO_2$ achieves this with a value of 10 ppm/K at room temperature and 10.1 ppm/K at 600° C. The variant $Y_2O_3$-stabilised $ZrO_2$ is to be preferred on account of its thermomechanical stability.

However, $Al_2O_3$ or ceramic mixed oxides such as $Al_2O_3$/$TiO_2$ or $Al_2O_3$/MgO or $Al_2O_3$/Z can also be used, as long as the coefficient of thermal expansion of the ceramic is adapted to that of the ferritic basic material. It is to be noted that the electric insulating action is lower in ceramic mixed oxides and should be sufficiently high at 600° C. (application temperature). The thickness of the ceramic sprayed layer 5 might lie at approximately 0.1 mm, but in principle it should be as thin as possible, possibly 30 μm. According to experience, the $Al_2O_3$ layer which is sprayed on with a thickness of 30 μm achieves transfer resistances to the metallic basic material of 10 MΩ or more.

In a further step, for example, electric conductor tracks 6 are applied to the ceramic insulating layers 5, for example by way of thermal spraying such as wire flame spraying. Positioning of the electric conductor tracks can likewise take place via masks. A housing element 4, as is obtained after the application of the electric conductor tracks, is shown in FIG. 3. Ferritic stainless steel is again suitable as material for the electric conductor tracks 6. A structure of ferritic basic material 3, 4, 22, 23, ceramic 5 and conductor tracks 6 would therefore be obtained which has a very similar coefficient of thermal expansion and therefore makes very low thermomechanical stresses possible during operation. 1.4509, 1.4122 or similar materials are suitable as candidate materials. One variant is to spray on nickel as conductor track 6. The motivation here is to provide a conductor track surface which can be soldered to a thermoelectric material without particularly aggressive flux materials. Although the coefficient of thermal expansion of nickel at approximately 13 ppm/K is greater than that of the ferrite/ceramic composite, it is not very much greater. One advantage of the nickel in comparison with stainless steel is a specific electrical resistance which is lower by a factor of 10 and permits considerably smaller line cross sections in comparison with stainless steel.

Barrier layers 9 can optionally also be sprayed onto the conductor tracks or onto the TE materials, again via masks, in order to confine undesirable element diffusion during operation into the TE materials 7, 8 or out of the TE materials. For example, Cr or Ni or alloys thereof may be suitable as materials for the barrier layer. A nickel conductor track would have the dual purpose that it not only conducts the thermoelectric current, but also itself represents a barrier layer. A sprayed Ni barrier layer on the TE material would have the additional purpose that a formation in terms of joining technology of the structure on a conductor track is facilitated considerably as a result of the mechanical interlocking of the joining material in the sprayed Ni layer. In an analogous manner to the metallic basic material, an oxide layer which disrupts the adhesion of the sprayed layer can also be removed by sandblasting, etching, etc. before the spraying-on operation. As an alternative to nickel, another barrier material can also be sprayed, such as Cr.

Thermoelectric materials in block form 7, possibly including barrier layers, can be attached in a material-to-material manner to the conductor tracks by soldering, and thus all materials can be combined to form a thermoelectric module 2, 24. A housing element with a plurality of thermoelectric materials which are applied in this way is shown in a perspective view in FIG. 4. It should be clear to a relevant person skilled in the art that the coefficient of thermal expansion of the thermoelectric material and of the solder should also lie at room temperature (RT) in the region of, for example, 10 ppm/K, in order to ensure operation which is as stress-free as possible. This is achieved, for example, by n-conducting $CoSb_3$ T-skutterudites with a coefficient of thermal expansion between 200° C. and 600° C. of 12.2 ppm/K. MCoSb (where M=Zr, Fe or Hf) or the skutterudite $CeFe_3$, $RuSb_{12}$ with a coefficient of expansion of 14.5 ppm/K between 200° C. and 600° C. is available as p-conducting TE-active material.

An alternative joining process for TE materials in block form is what is known as silver sintering or silver pressure sintering. Here, the blocks and the conductor tracks which are precoated in a suitably wettable manner, for example by way of an Ag layer which is sprayed on, are joined together at approximately 200° C. or optionally at an increased temperature or pressure application with the use of an Ag paste. The Ag joined seam subsequently has a porosity of approximately 30%. If fine-grained Ag particles are used, optionally in the nano-range, the joining temperature and/or the joining pressure can be reduced. Although the porosity of the joined seam then increases to approximately 50%, it still has a sufficiently great thermal conductivity. The Ag interlocks mechanically into the rough sprayed ceramic layer and exhibits very satisfactory adhesion. In addition to the use of Ag with defined sintering additives, the use of Ag alloys is also possible.

A further alternative joining process for TE materials in block form is the use of exothermic reactive nano-soldering foils. The advantage is that only the solder melts which is applied to both sides of the reaction foil or of the joining partners (as always optionally after the application of suitable adhesion layers) and the temperature loading of possibly temperature-sensitive TE materials does not occur.

In principle, it is also conceivable and also preferred to thermally spray the thermoelectric material 8, for example, onto a conductor track 6. A solder as disruption of the co-ordinated CTE material composite does not then have to be used. Soldering would then only have to be carried out on one side onto a conductor track. The advantage would be that this one joined seam could be positioned on the cold side of the module and the thermomechanical loading of the joined location would therefore tend to be low during the thermocyclic operation. Low-melting solders, such as tin-based solders, could then be used, with consideration for suitable coatings of the joining partners. A further advantage would be the satisfactory mechanical interlocking of the sprayed TE material into the conductor track which is likewise sprayed and therefore rough.

One preferred dimension for the blocks 7, 8 (either joined as blocks by means of soldering or constructed by way of thermal spraying) is approximately from 0.5×0.5 mm to 1.0×1.0 mm; or from 1.0×1.0 mm to 5.0×5.0 mm. The reason is that, in the case of these rather small dimensions, rather small differential lengths dl between the blocks and conductor tracks which are adjacent and are connected to the blocks in a material-to-material manner are also formed by the thermal expansion, which differential lengths lead to thermomechanical stresses which tend to be relatively low.

The thermoelectric module can then be finished by virtue of the fact that a further housing element 3 is placed onto the exposed thermoelectric materials and is connected in a fluid-tight manner to the (first) housing element. A step of this type can be gathered, for example, from FIG. 5 in the perspective illustration. The further housing element 3 can previously be treated in an analogous manner to the housing element 4, for example can be provided with a ceramic layer and/or electric conductor tracks which are connected to the thermoelectric materials 7, 8. The connection might take place by way of the above-described soft solder. As an alternative, adhesive bonding by way of a temperature-stable adhesive, for example on the basis of silicone or by means of Ag sintering or Ag pressure sintering, is also possible. FIG. 6 and FIG. 7 shows cross-sectional views of the assembly of the individual housing parts to form the thermoelectric module, FIG. 6 showing the not yet closed state of the thermoelectric module and FIG. 7 showing the closed state of the thermoelectric module.

The finished module which ends on both sides, for example, with a metal sheet composed of ferritic stainless steel can ultimately be joined together with a heat exchanger 1 by laser welding. Here, the heat exchanger material is preferably also composed of ferritic stainless steel.

The above-described technique can be applied, for example, in a double-walled heat exchanger. A TE module can also be constructed independently of the construction which is disclosed in said document, however, which TE module might also protrude into a hot exhaust gas, for example.

In the following text, the construction of a thermoelectric module will be described in greater detail using the above-mentioned components.

The TEM 2 is formed, in particular, by a metallic enveloping body upper part 3 (for example, stainless steel) and a metallic enveloping body lower part 4 (for example, stainless steel), between which substantially TE-active materials 7, 8 are situated. The metallic enveloping body upper part 3 of the TEM 2 is in contact on the outer side with one of the two fluids 20 which flow through the TEG 1, and the metallic enveloping body lower part 4 of the TEM 2 is in contact with the other fluid 19 which flows through the TEG 1. An electric current is produced in the TEM 2 as a result of the temperature differences between fluids 1 19 and 2 20.

The upper part 3 and the lower part 4 have, for examples, a shell-like design, as is shown in FIG. 2, for example. In addition, the lower part 4 forms a lateral projection 16 which, together with the expanding bellows of the holding device 15, delimits a thermal partition 17, as is shown in FIG. 12. Said thermal partition 17 prevents thermal flow losses in the lateral region of the TEM/holding device 2, 11. The thermal partition 17 can be a fluid which is virtually at a standstill or a thermally insulating material.

The enveloping body parts 3, 4 are both coated on the inside, for example, with a nonconductor 5. Said nonconductor 5 is a ceramic and is applied to the enveloping body parts 3, 4, for example, by means of plasma spraying.

The conductors 6 (for example, stainless steel, nickel) are preferably applied to the nonconductor 5 by means of plasma spraying.

The TE materials 7, 8 are connected to the conductors 6, and they can either be sprayed 8 onto the latter or they are present as blocks 7. As blocks 7, they are attached to the conductors on the hot side, for example, by means of Ag or AgCu soldering or by means of silver sintering or silver pressure sintering. If the TE materials 8 are sprayed on, this preferably takes place on the hot side. The TE materials 7, 8 are attached to the conductors 6 on the cold side by means of Ag or AgCu or Sn soldering or by means of silver sintering or silver pressure sintering.

The lower part 4 and upper part 3 are connected to one another in the lateral region, preferably by means of laser welding, for example. This joining together of the individual housing parts is shown in FIG. 10, which results in the thermoelectric module which is shown in FIG. 11. FIG. 12 shows a cross-sectional view of a thermoelectric module 2 after assembly. As is shown in the longitudinal sectional view from FIG. 13, a plurality of thermoelectric modules 2 of this type can be combined to form a thermoelectric generator 1.

The upper part 3 is preferably exposed on the outer side to the hot gaseous fluid 19, 20 and is preferably profiled 10 for this purpose, in order to increase the thermal exchange and the transfer area. The lower part 4 can also be profiled if there is a corresponding necessity. The profiling 10 is, for example, a punched and/or formed metal sheet 10. The TEM/tube 24 is shown in FIG. 14. A cover 25 can then be placed onto the thermoelectric module which is profiled in this way, as is shown in the perspective view from FIG. 15. The result is a thermoelectric module, as is shown in FIG. 16, for example.

The TEM 2 is connected to the rim hole of the TEM cutout 12 of the holding device 111, 12, preferably by means of laser welding. The holding device 11 is equipped on the upper and lower sides with in each case one TEM 2.

The holding device 11 has openings 14, via which one of the two fluids 19, 20 can be fed to the TEMs 2 or the upper parts/lower parts 3, 4 of the TEMs 2. The second fluid 20, 19 flows around the outer side of the construction of the TEM with holding device 2, 11.

The expanding bellows of the holding device 15 serves to form a thermal partition 17. The holding device 11 is not restricted to the use of a TEM 2 with metallic enveloping body 3, 4, but rather can optionally also be joined to a TEM with ceramic enveloping body. In this case, the expanding bellows of the holding device 15 can also serve to absorb the differences in the thermal expansions of the different materials during operation, with the result that the TEMs with ceramic enveloping body are not damaged. As an alternative or in addition, the holding device can have a plurality of vertically and/or horizontally running thinned material portions 31 which likewise serve this purpose.

In particular in the lateral region (on the inner side or outer side), the holding device 11 can additionally be provided with an insulating material 18, in order to avoid heat losses, as a result of which the expanding bellows of the holding device 15 can possibly be dispensed with.

If a TEM with ceramic enveloping body is used, it can be necessary not to insulate the connection (for example, soldered connection, adhesive bond) between the TEM with ceramic enveloping body and the holding device 11, with the result that the connection is cooled significantly by the cold fluid, as a result of which said connection is then protected against high temperatures and thermal cycling.

The above-described method for the production of the thermoelectric module is not restricted to the TEM 2 with holding device 11 as described here, but rather relates to every TEM design with the use of a metallic enveloping body.

The TEMs 2 with holding devices 11 or the TEM/tubes 24 are installed in columns and/or rows in any desired number in a TEG 1. To this end, the holding devices 11 of the TEMs 2 are connected at their opening regions 14 to bottoms 28 (preferably by laser welding). The TEG 1 therefore substantially comprises a plurality of TEMs 2 with holding device 11 or TEM/tubes 24 which are stacked one above another, and bottoms 28, diffusers 27, a housing 29 and various electronic components such as lines and/or sockets which connect the TEG 1 electronically to the outside and also possibly connect the TEMs 2 or the TEM/tubes 24 among one another in series or in parallel. The diffusers 27 and/or the housing 29 are/is configured with openings in this regard for the electric connection of the TEG 1. The TEMs 2 with holding device 11 or the TEM/tubes 24 are spaced apart from one another and are not in mutual contact to this extent. The bottoms 28 are connected to the housing 29 and/or the diffusers 27. Housing 29 and diffusers 27 can be connected to one another. A construction of this type of a thermoelectric generator 1 can be gathered from FIG. 17.

To the TEG 1, the first fluid 19 or second fluid 20 is fed via the opening 26 to the diffuser 27. It 19, 20 is subsequently fed to the interior of the holding devices 11 or the inner tubes 22 of the TEM/tubes 24. Afterward, it 19, 20 passes into the second diffuser 27 and is finally conducted out via its opening 26.

The second fluid 20, 19 communicates via an opening 26 in the housing 29 with the TEG 1. The second fluid 20, 19 flows around the exterior of the constructions TEM 2 with holding device 11 or the outer tubes 23 of the TEM/tubes 24 in the housing 29 and is conducted out again via a second opening 26 in the housing 29.

The second fluid 20, 19 can be deflected multiple times in the housing. To this end, the TEMs 2 with holding device 11 or TEM/tubes 24 and/or the housing 29 are/is equipped with one or more deflection plates 30. The bottoms 28 separate the first fluid (19) region in the TEG 1 from the second fluid (20) region in the axial direction.

FIG. 18 shows a perspective view of a holding device with thinned material portions, as can be used for the production of a thermoelectric module according to the above description.

Operated by electricity, the above-described TEG can also be utilized as a thermoelectric heater or cooler TE-HK.

The above-described approach makes very satisfactory generation of electrical energy from thermal energy and optimization of the TEG and/or TEM possible, in particular.

The exemplary embodiments which are described are selected only by way of example and can be combined with one another.

LIST OF DESIGNATIONS

1 TEG: Thermoelectric generator
2 TEM: Thermoelectric module
3 Upper part of the enveloping body of the TEM (stainless steel)
4 Lower part of the enveloping body of the TEM (stainless steel)
5 Nonconductor as sprayed-on ceramic coating using the plasma spraying process (for example, aluminum oxide or zirconium oxide)
6 Conductor as sprayed-on coating using the plasma spraying process (for example, nickel or stainless steel)
7 TE (thermoelectrically) active materials (for example, half-Heusler compounds, skutterudites, silicides, BiTe, PbTE)
8 Sprayed-on TE (thermoelectrically) active materials (for example, half-Heusler compounds, skutterudites, silicides, BiTe, PbTE)
9 Barrier layer
10 Profiling: ribbing, knobs, gills, winglets, embossment, turbulence insert
11 Holding device (stainless steel)
12 TEM cutout in holding device
13 Rim hole of the TEM cutout
14 Opening of the holding device
15 Expanding bellows of the holding device
16 Lateral projection in the lower or upper part for forming a thermal partition or for connecting two TEMs
17 Thermal partition
18 Insulating material of the TEM and/or the holding device
19 Fluid 1
20 Fluid 2
21 Double-walled tube (double tube)
22 Inner tube of the double-walled tube
23 Outer tube of the double-walled tube
24 TEM/tube: combination of TEM and double-walled tube
25 TEM/tube cover
26 Connecting line or connecting opening
27 Diffuser
28 Bottom
29 Housing
30 Deflection plate
31 Thinned material portions or notches
32 Double TEM: two TEMs are connected to one another
100 Method for the production of a thermoelectric module
110 Application step
120 Arrangement step
130 Attachment step

The invention claimed is:

1. A thermoelectric module having the following features:
a metallic housing element, wherein the metallic housing element has a mechanically roughened surface;
a ceramic layer which is applied by spraying on the metallic housing element, wherein the ceramic layer mechanically interlocks with the roughened surface of the metallic housing element, wherein the ceramic layer has a rough surface opposite the metallic housing element;
an electrically conductive region directly applied to the ceramic layer;
at least one thermoelectrically active material directly arranged on the electrically conductive region; and
a further housing element which is arranged on a side of the metallic housing element having the ceramic layer, wherein the further housing element and the metallic housing element are connected to form a fluid-tight housing,
wherein the at least one thermoelectrically active material is arranged in the fluid-tight housing, wherein a coefficient of thermal expansion of the ceramic layer and a coefficient of thermal expansion of the electrically conductive region are each within 20% of a coefficient of thermal expansion of the metallic housing element.

2. A thermoelectric apparatus having the following features:
a first thermoelectric module comprising a thermoelectric module as claimed in claim 1 which has a projection on the metallic housing element or on the further housing element of the first thermoelectric module;
a second thermoelectric module comprising a thermoelectric module as claimed in claim 1, in which the metallic housing element or the further housing element of the second thermoelectric module is fastened in a fluid-tight manner to the projection in such a way that a chamber for conducting a fluid is formed between the first and second thermoelectric modules.

3. A thermoelectric apparatus having the following features:
a first thermoelectric module as claimed in claim 1;
a second thermoelectric module as claimed in claim 1; and
a holding device which connects the first and second thermoelectric modules to one another in a fluid-tight manner, with the result that a chamber for conducting a fluid is formed between the first and second thermoelectric modules.

4. The thermoelectric apparatus as claimed in claim 2, wherein the housing element or the further housing element of the first thermoelectric module has a projection, the second thermoelectric module being arranged on the projection in such a way that the projection acts as a thermal partition element between the first and second thermoelectric modules.

5. The thermoelectric module according to claim 1, wherein the metallic housing element comprises a ferritic stainless steel.

6. The thermoelectric module according to claim 1, wherein the ceramic layer comprises a material selected from the group consisting of $ZrO_2$, $Al_2O_3$, $Al_2O_3/TiO_2$, $Al_2O_3/MgO$, $Y_2O_3/ZrO_2$, and $Al_2O_3/Z$.

7. The thermoelectric module according to claim 1, wherein the electrically conductive region comprises a material selected from the group consisting of a ferritic stainless steel, Cr, Cr alloys, Ni, and Ni alloys.

8. A thermoelectric module having the following features:
a metallic housing element, wherein the metallic housing element has a mechanically roughened surface;
a ceramic layer which is applied by spraying on the metallic housing element, wherein the ceramic layer mechanically interlocks with the roughened surface of the metallic housing element, wherein the ceramic layer has a rough surface opposite the metallic housing element;
an electrically conductive region directly applied by spraying to the ceramic layer, wherein the electrically conductive region mechanically interlocks with the ceramic layer, wherein the electrically conductive region has a rough surface opposite the ceramic layer;

at least one thermoelectrically active material arranged on the electrically conductive region, wherein the at least one thermoelectrically active material is applied via spraying to the electrically conductive region, wherein the thermoelectrically active material mechanically interlocks with the ceramic layer; and a further housing element which is arranged on a side of the metallic housing element having the ceramic layer, wherein the further housing element and the metallic housing element are connected to form a fluid-tight housing, wherein the at least one thermoelectrically active material is arranged in the fluid-tight housing, wherein a coefficient of thermal expansion of the ceramic layer and a coefficient of thermal expansion of the electrically conductive region are each within 20% of a coefficient of thermal expansion of the metallic housing element, wherein the metallic housing element comprises a ferritic stainless steel, wherein the ceramic layer comprises a material selected from the group consisting of $ZrO_2$, $Al_2O_3$, $Al_2O_3/TiO_2$, $Al_2O_3/MgO$, $Y_2O_3/ZrO_2$, and $Al_2O_3/Z$, wherein the electrically conductive region comprises a material selected from the group consisting of a ferritic stainless steel, Cr alloys, and Ni alloys.

9. The thermoelectric module according to claim 8, produced by a method having the following steps:

roughening the metallic housing element and removing an oxide layer from the surface of the metallic housing element using sandblasting or etching, applying the ceramic layer to the metallic housing element using plasma spraying;

applying the electrically conductive region to the ceramic layer using thermal spraying;

arranging the at least one thermoelectrically active material on the electrically conductive region such that the ceramic layer and the electrically conductive region are situated between the metallic housing element and the thermoelectrically active material; and attaching the further housing element.

10. The thermoelectric module according to claim 8, wherein the ceramic layer comprises $Y_2O_3/ZrO_2$.

11. The thermoelectric module according to claim 6, wherein the ceramic layer comprises $Y_2O_3/ZrO_2$.

12. The thermoelectric module according to claim 1, wherein the electrically conductive region is applied via spraying to the ceramic layer, wherein the electrically conductive region mechanically interlocks with the ceramic layer, wherein the electrically conductive region has a rough surface opposite the ceramic layer.

13. The thermoelectric module according to claim 12, wherein the at least one thermoelectrically active material is applied via spraying to the electrically conductive region, wherein the thermoelectrically active material mechanically interlocks with the ceramic layer.

14. A method for the production of a thermoelectric module according to claim 1, the method having the following steps:

application of a ceramic layer to a metallic housing element and electric conductor tracks hereto;

arrangement of at least one thermoelectrically active material on the housing element, the arrangement taking place in such a way that the ceramic layer and the electric conductor tracks are situated between the metallic housing element and the thermoelectrically active material; and attachment of a further housing element, with the result that the thermoelectrically active material is closed in a fluid-tight manner between the housing element and the further housing element and is connected electrically, in order to produce the thermoelectric module.

15. The method as claimed in claim 14, wherein the attachment step comprises a part step of spraying ceramic basic material onto the metallic housing element, the ceramic basic material being configured to form the ceramic layer.

16. The method as claimed in claim 14, wherein a material is applied to the housing element in the application step, which material is configured to form a ceramic layer which has a coefficient of thermal expansion which corresponds within a tolerance range to a metallic and thermoelectric material of the housing element.

17. The method as claimed in claim 14, wherein a part step of the formation of at least one electrically conductive region on the ceramic layer is carried out in the application step, the at least one thermoelectrically active material being applied on the electrically conductive region in the arrangement step.

18. The method as claimed in claim 17, wherein the formation part step comprises spraying on of an electrically conductive material, such as Cu or Ag or alloys thereof, in order to form the electrically conductive regions.

19. The method as claimed in claim 17, wherein a material is applied to the ceramic layer in the formation part step, which material corresponds to the material, from which the metallic housing element is formed, or in which method nickel is applied to the ceramic layer in the formation part step, in order to form the electrically conductive region.

20. The method as claimed in claim 17, wherein a silver sintering or silver pressure sintering process is used in the arrangement step for the material-to-material connection of the thermoelectrically active material to the at least one electrically conductive region.

21. The method as claimed in claim 17, wherein a process, in which a soldering foil is used, for the material-to-material connection of the thermoelectric material to the at least one electrically conductive region is used in the arrangement step.

22. The method as claimed in claim 14, wherein, before the arrangement, the thermoelectrically active material is coated by means of thermal spraying with a barrier layer, for example comprising Ni, Cr or alloys thereof.

23. The method as claimed in claim 17, wherein the thermoelectrically active material is sprayed onto the electrically conductive region in the arrangement step.

* * * * *